US009590160B2

(12) United States Patent
Dell et al.

(10) Patent No.: US 9,590,160 B2
(45) Date of Patent: Mar. 7, 2017

(54) THERMOELECTRIC POWER GENERATION DEVICE

(71) Applicant: Cooper Union for the Advancement of Science, New York, NY (US)

(72) Inventors: Robert Dell, Tappan, NY (US); Chih-Shing Wei, Lattingtown, NY (US); George Sidebotham, Babylon, NY (US)

(73) Assignee: COOPER UNION FOR THE ADVANCEMENT OF SCIENCE, New York, NY (US)

( * ) Notice: Subject to any disclaimer, the term of this patent is extended or adjusted under 35 U.S.C. 154(b) by 50 days.

(21) Appl. No.: 14/335,093

(22) Filed: Jul. 18, 2014

(65) Prior Publication Data

US 2016/0365500 A1    Dec. 15, 2016

Related U.S. Application Data

(63) Continuation of application No. 12/519,056, filed as application No. PCT/US2007/024597 on Nov. 29, 2007, now Pat. No. 8,829,326, which is a continuation of application No. 11/639,378, filed on Dec. 14, 2006, now abandoned.

(51) Int. Cl.

| H01L 35/08 | (2006.01) |
| H01L 35/30 | (2006.01) |
| H01L 35/06 | (2006.01) |
| F28D 15/02 | (2006.01) |
| H01L 27/16 | (2006.01) |

(52) U.S. Cl.
CPC .......... *H01L 35/30* (2013.01); *F28D 15/0275* (2013.01); *H01L 27/16* (2013.01); *H01L 35/06* (2013.01); *Y10T 29/53113* (2015.01); *Y10T 137/8158* (2015.04)

(58) Field of Classification Search
USPC ....................................................... 136/200
See application file for complete search history.

(56) References Cited

U.S. PATENT DOCUMENTS

| 4,520,305 | A | 5/1985 | Cauchy |
| 6,150,601 | A | 11/2000 | Schnatzmeyer et al. |
| 6,307,142 | B1 | 10/2001 | Allen et al. |
| 2003/0136548 | A1 | 7/2003 | Parish et al. |
| 2006/0266404 | A1 | 11/2006 | Hiller et al. |

(Continued)

FOREIGN PATENT DOCUMENTS

| GB | 2 140 206 | 11/1984 |
| GB | 2 145 876 | 4/1985 |

(Continued)

OTHER PUBLICATIONS

International Search Report for PCT/US2007/024597, mailed on Dec. 15, 2008.

*Primary Examiner* — Jayne Mershon
(74) *Attorney, Agent, or Firm* — Goodwin Procter LLP

(57) ABSTRACT

The invention relates to a thermoelectric-based power generation system designed to be clamped onto the outer wall of a steam pipe or other heating pipe. The system can include a number of assemblies mounted on the sides of a pipe. Each assembly can include a hot block, an array of thermoelectric modules, and a cold block system. The hot block can create a thermal channel to the hot plates of the modules. The cold block can include a heat pipe onto which fins are attached.

13 Claims, 11 Drawing Sheets

(56) References Cited

U.S. PATENT DOCUMENTS

| | | | |
|---|---|---|---|
| 2007/0125413 | A1 | 6/2007 | Olsen et al. |
| 2008/0083446 | A1 | 4/2008 | Chakraborty et al. |
| 2008/0314430 | A1 | 12/2008 | Ghoshal |

FOREIGN PATENT DOCUMENTS

| | | |
|---|---|---|
| GB | 2 409 473 | 6/2005 |
| JP | 59-75684 | 4/1984 |
| JP | 60125181 | 7/1985 |
| WO | WO-2008/042073 | 4/2008 |
| WO | WO-2008/042077 | 4/2008 |

| SUBSYSTEM | PARAMETER | SYMBOL | VALUE |
|---|---|---|---|
| COLD BLOCK | Fin THICKNESS | t | 0.02 INCH FOR ALUMINUM 0.03 INCH FOR COPPER |
| | Fin LENGTH | L | 3 INCH = 7.62 cm |
| | Fin SPACING | $\Delta x$ | 0.25 INCH = 0.635 cm |
| | HEAT PIPE OUTER DIAMETER | d | 0.66 INCH = 1.68 cm |
| | NUMBER OF FINS | N | 41 |
| | CONVECTION COEFFICIENT | h | 5.6 W/m²·C |
| MODULE ARRAY | NUMBER OF MODULES | $n_M$ | 3 |
| | SEEBECK COEFFICIENT | $S_v$ | 0.050 V/K |
| | THERMAL CONDUCTANCE | $K_M$ | 0.54 W/K |
| | MODULE DIMENSION | W | 4 cm |
| HOT BLOCK | STEAM PIPE THICKNESS | $t_{pipe}$ | 3/16 INCH = 4.8 mm |
| | STEAM PIPE OUTER DIAMETER | $d_{pipe}$ | 3.5 INCH = 8.9 cm |
| | CONDENSING CONVECTION COEFFICIENT | $h_{steam}$ | 6000 W/m²·C |
| | STEAM CONDENSING AREA | $A_s$ | 48 cm² |
| | PIPE/BLOCK CONTACT AREA | $A_{s,1}$ | 48 cm² |
| | BLOCK AVERAGE THICKNESS | $t_{block}$ | 5/8 INCH = 1.7 cm |
| | BLOCK/MODULE CONTACT AREA | $A_{1,2}$ | 48 cm² |
| SOURCE TEMPERATURES | STEAM TEMPERATURE | $T_{H\infty}$ | 350°F = 177°C |
| | ROOM AMBIENT TEMPERATURE | $T_{C\infty}$ | 135°F = 58°C |

FIG. 9A

|  | PARAMETER | SYMBOL | VALUE |
|---|---|---|---|
| COLD BLOCK | CHARACTERISTIC FIN LENGTH | $L^*$ | 19.0 cm FOR ALUMINUM<br>33.0 cm FOR COPPER |
|  | SINGLE FIN THERMAL RESISTANCE | $R_{fin}$ | 17.8 °C/W FOR ALUMINUM<br>16.2 °C/W FOR COPPER |
|  | COLD/MODULE CONTACT RESISTANCE | $R_{contact,C}$ | 0.01 °C/W [ASSUMED] |
|  | COLD BLOCK THERMAL RESISTANCE | $R_C$ | 0.45 °C/W FOR ALUMINUM<br>0.41 °C/W FOR COPPER |
| MODULE ARRAY | ARRAY THERMAL RESISTANCE | $R_M$ | 1.85 °C/W |
| HOT BLOCK | CONDENSING THERMAL RESISTANCE | $R_{S,1}$ | 0.035 °C/W |
|  | STEAM PIPE THERMAL RESISTANCE | $R_{1,2}$ | 0.025 °C/W |
|  | THRU-BLOCK THERMAL RESISTANCE | $R_{2,H}$ | 0.083 °C/W |
|  | PIPE/BLOCK CONTACT RESISTANCE | $R_{contact,H1}$ | 0.01 °C/W [ASSUMED] |
|  | BLOCK/MODULE CONTACT RESISTANCE | $R_{contact,H2}$ | 0.01 °C/W [ASSUMED] |
|  | HOT BLOCK THERMAL RESISTANCE | $R_H$ | 0.152 °C/W |

FIG. 9B

THERMOELECTRIC POWER GENERATION DEVICE

CROSS-REFERENCE TO RELATED APPLICATIONS

This application is a continuation of U.S. patent application Ser. No. 12/519,056, filed Feb. 5, 2010, which is a U.S. National Stage of International Application Serial No. PCT/US2007/024597, filed Nov. 29, 2007, which claims priority to and the benefit of co-pending U.S. patent application Ser. No. 11/639,378, filed Dec. 14, 2006, the disclosures of which are incorporated herein by reference in their entireties.

FIELD OF THE INVENTION

The present invention relates generally to the field of thermoelectric power generation and more particularly to portable devices that can be releasably coupled to a steam pipe to provide electrical power to an instrument associated therewith.

BACKGROUND OF THE INVENTION

Steam pipe systems, and other fluid piping systems, are often used for the heating of buildings and other structures. Monitoring the conditions within the pipes is of vital importance for the safe and efficient working of these systems. As such, it is necessary to incorporate flow and temperature meters into the pipe systems in order to monitor the working conditions of the pipes, and associated fluids, at important locations within the system.

Modern steam meters require DC power. If available, standard AC power is easily converted to the required DC power. If not, a separate power line must be installed and maintained. To provide a suitable consistent power source, meters, and other electrical monitoring or safety devices, are generally connected to the main power supply of a building. Alternatively, other power sources, such as batteries, may be used.

In recent years, other means of generating power for electrical devices have been developed and implemented. One method involves the use of thermoelectric modules to take advantage of a temperature difference between two locations in a body, such as between the temperature within a pipe and the temperature of the surrounding atmosphere. Example devices are described in U.S. Pat. No. 4,673,863 to Swarbrick, and U.S. Pat. No. 4,095,998 to Hanson. These devices describe hollow cylindrical voltage generation devices that can be mounted onto, or replace, an exhaust pipe of an automobile. The cooling effect necessary to obtain the required temperature difference is provided by the flow of air over the external surface of the device, which is produced by the movement of the automobile. These devices appear to be suitable only for use with automobile exhausts, at least because they require significant moving air to provide the necessary cooling, and because they cannot retroactively be fitted onto a closed loop pipe system.

Another example device, for use with sub-sea drilling wells, is described in U.S. Pat. No. 5,939,667 to Oudoire et al. Again, however, the disclosed device appears to consist of a hollow cylindrical device that is coupled permanently into a piping system and cannot be retroactively fitted onto an existing closed loop pipe system.

SUMMARY OF THE INVENTION

The present invention provides a thermoelectric power generation system configured to be releasably coupled to a steam pipe or other object. In one embodiment of the invention, the thermoelectric power generation system is a point-of-use generator that is independent of the electrical grid and contains no moving parts. The system can easily be clamped onto the exterior of existing pipe with no violation of the integrity of the existing steam system. One embodiment of the invention includes a theoretical model of the thermoelectric power generation system which yields excellent agreement with the working model.

One embodiment of the invention includes an apparatus for thermoelectrically generating power from a heat source. The apparatus can include at least three layers. The first layer can include a first heat transfer element, wherein a first surface of the first heat transfer element is configured to conform to at least a portion of the outer surface of the heat source. The second layer can include at least one thermoelectric module, wherein the thermoelectric module generates an electrical signal in response to a temperature difference over the thickness of the at least one thermoelectric module. The third layer can include a second heat transfer element, wherein the second heat transfer element includes a mounting block and a heat exchanging element, and wherein the heat exchanging element is configured to exchange heat between the second heat transfer element and the surrounding atmosphere.

In one embodiment, the heat source can include a fluid transportation pipe, such as a steam pipe or other piping system used, for example, in a building heating system. The heat exchanging element can include a plurality of fins. The plurality of fins can be rectangular. The heat exchanging element can further include at least one elongate element extending from the mounting block. The elongate element can include a heat pipe, a solid rod, and/or a hollow rod. The heat pipe, solid rod, and/or hollow rod can be manufactured from a metal such as, but not limited to, copper. The plurality of fins can be distributed on the elongate element. The at least one elongate element can extend at a shallow angle from the mounting block.

In one embodiment, the apparatus can further include a second surface of the first heat transfer element substantially opposite the first surface of the first heat transfer element, wherein the second surface of the first heat transfer element is substantially flat. The first surface of the first heat transfer element can include at least one groove. The first heat transfer element can include a substantially similar material to the outer surface of the heat source. The at least one thermoelectric module can be configured to power at least one electrical device associated with the heat source. In one embodiment, the at least one electrical device can be a control device, a measurement device, a safety device, a security device, a light, a communication device, a steam flow meter, a temperature meter, a humidity meter, a gas meter, a cut-off valve controller, and/or an alarm.

Another aspect of the invention can include an apparatus for thermoelectrically generating power from a heat source, wherein the apparatus includes at least one thermoelectric power generation assembly for attachment to a heat source. The at least one assembly can include at least three layers. The first layer can include a first heat transfer element, wherein a first surface of the first heat transfer element is configured to conform to at least a portion of the outer surface of the heat source. The second layer can include at least one thermoelectric module, wherein the thermoelectric module generates an electrical signal in response to a temperature difference over the thickness of the thermoelectric module. The third layer can include a second heat transfer element, wherein the second heat transfer element comprises a mounting block and a heat exchanging element, and wherein the heat exchanging element is configured to exchange heat between the second heat transfer element and the surrounding atmosphere.

In one embodiment, the apparatus can include at least two thermoelectric power generation assemblies. The apparatus can further include a mounting element. The mounting element can be configured to releasably couple the at least two thermoelectric power generation assemblies to the heat source, and in one example embodiment, at least six or more thermoelectric power generation assemblies can be coupled together. In one embodiment, the apparatus can further include a means of directing a fluid over the heat exchanging element.

In one embodiment, the at least one thermoelectric power generation assembly can power one or more electrical devices. The at least one electrical device can be a control device, a measurement device, a safety device, a security device, a light, a communication device, a steam flow meter, a temperature meter, a humidity meter, a gas meter, a cut-off valve controller, and/or an alarm. In one embodiment, the communication device can include a wireless communication system configured to communicate with a remotely located monitoring station.

Another aspect of the invention can include a method of thermoelectrically powering an electrical device. The method can include the steps of providing at least one thermoelectric power generation apparatus, releasably mounting the thermoelectric power generation apparatus to an outer surface of a heat source, coupling the thermoelectric power generation apparatus to an electrical device, and providing power to the electrical device. The electrical power can be generated in response to a temperature difference over the thermoelectric power generation apparatus.

The thermoelectric power generation apparatus can include three layers. The first layer can include a first heat transfer element, wherein a first surface of the first heat transfer element is configured to conform to at least a portion of the outer surface of the heat source. The second layer can include at least one thermoelectric module. The third layer can include a second heat transfer element, wherein the second heat transfer element comprises a mounting block and a heat exchanging element, and wherein the heat exchanging element is configured to exchange heat between the second heat transfer element and the surrounding atmosphere.

In one embodiment of the invention, the method can further provide at least two thermoelectric power generation apparatus. The at least two thermoelectric power generation apparatus can be coupled together by a mounting element. The mounting element can be configured to releasably couple the at least two thermoelectric power generation assemblies to the heat source.

Another aspect of the invention can include an apparatus for thermoelectrically generating power from a temperature differential between at least a portion of a fluid transportation system and a surrounding atmosphere. The apparatus can include a mounting element and at least one thermoelectric module coupled to the mounting element. The at least one thermoelectric module can generate electrical power in response to a temperature difference over a thickness of the thermoelectric module. The apparatus can also include a heat exchanging element, wherein the heat exchanging element is configured to exchange heat between the apparatus and the surrounding atmosphere.

In one embodiment, a first surface of the mounting element is configured to conform to at least a portion of an outer surface of the fluid transportation system. In one embodiment, the fluid transportation system can include a pipe.

Another aspect of the invention can include a method of thermoelectrically powering an electrical device. The method can include the step of providing at least one thermoelectric power generation apparatus, wherein the thermoelectric power generation apparatus includes a mounting element, at least one thermoelectric module coupled to the mounting element, and a heat exchanging element. The method can also include the steps of releasably mounting the thermoelectric power generation apparatus to the outer surface of a fluid transportation system, coupling the thermoelectric power generation apparatus to an electrical device, and providing power to the electrical device. The electrical power can be generated by the at least one thermoelectric module in response to a temperature difference between an outer surface of the fluid transportation system and a surrounding atmosphere.

In one embodiment, the outer surface of the fluid transportation system is at a higher temperature than the surrounding atmosphere. In another embodiment, the outer surface of the fluid transportation system is at a lower temperature than the surrounding atmosphere.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 9A is a table of parameter values for an example thermoelectric power system, in accordance with one embodiment of the invention;

FIG. 9B is a table of derived thermal quantities for the thermoelectric power system of FIG. 9A;

DETAILED DESCRIPTION OF THE INVENTION

The present invention discloses a DC power source sufficient to run a modern steam meter using thermal energy from a steam pipe. The power source includes a hot block for a thermoelectric power system being releasably coupled to the exterior of an exposed steam pipe. An example of an appropriate steam meter is a Krohne Vortex Steam Meter, manufactured by KROHNE, Inc., of 7 Dearborn Road, Peabody, Mass. 01960, although the present invention may be used to power any appropriate electrical device. In alternative embodiments the electrical device can be one or more of a control device, a measurement device, a safety device, an alarm, a security monitoring system, a lighting system, and/or one or more Light emitting diodes (LEDs). In one example embodiment, the power source can generate sufficient power to run up to approximately 100 LEDs simultaneously. In one example embodiment, one or more super-brite white light LED can be used.

Figure 1:
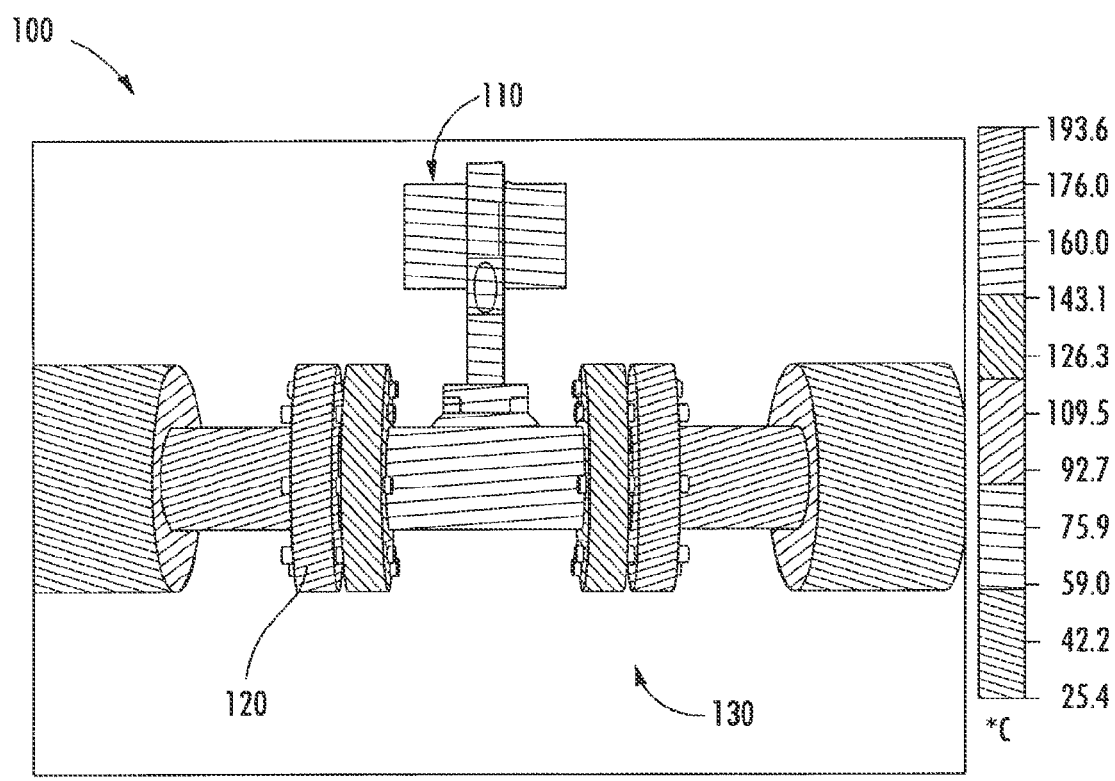
FIG. 1 is an example thermal image of an exposed steam pipe and steam meter, in accordance with one embodiment of the invention.

A thermal image 100 of an example steam meter 110 incorporated into a steam pipe 120 is shown in FIG. 1. The exterior temperature of the exposed pipe 120 in this example embodiment is of the order of 160° C. (320° F.). The ambient temperature of a steam room 130 can often approach 60° C. (139° F.), giving an available temperature difference between the high temperature source and low temperature sink on the order of 100° C.

Figure 2A:
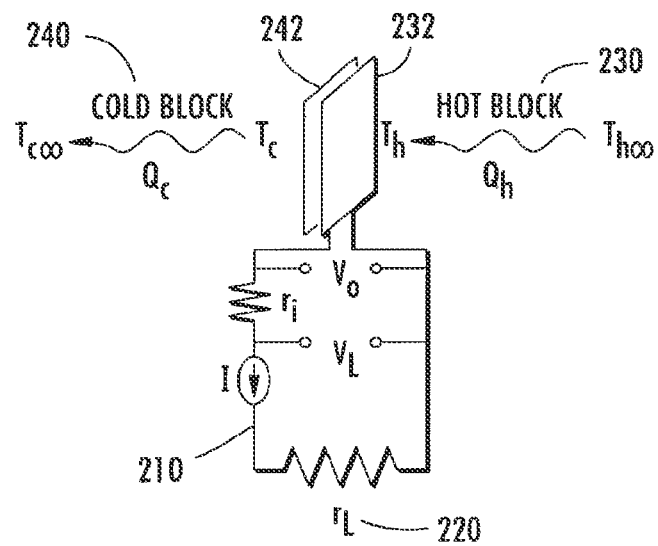
FIG. 2A is a schematic illustration of a thermoelectric module, in accordance with one embodiment of the invention.
Figure 2B:
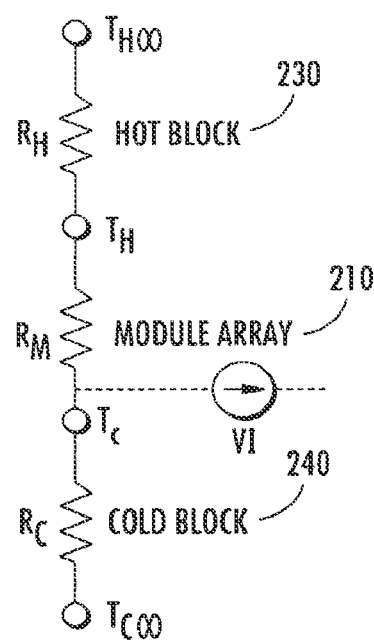
FIG. 2B is a schematic illustration of a thermal resistance network for the thermoelectric module of FIG. 2A.

At the heart of a thermoelectric power generation system is one or more thermoelectric modules (TEMs). An example configuration for a TEM, in accordance with one embodiment of the invention, is shown in FIGS. 2A and 2B. In this embodiment, thermoelectric power generation is based on the Peltier effect (the same physical phenomenon used in a thermocouple), in which an electromotive force (voltage and/or current) is generated when two dissimilar metals are connected to form two junctions maintained at different temperatures ($\Delta T$). Thermocouples are used as temperature measurement devices, while thermoelectric modules can be used to generate electricity.

Manufacturers often configure thermoelectric modules into thermopiles (multiple junctions configured in series to boost the output). In one embodiment, a thermoelectric module 210 consists of two thin ceramic plates 232, 242 with two connecting wires. If the two plates are maintained at different temperatures ($\Delta T>0$), there will be a direct current (DC) electrical output. A thermoelectric power system 200, as shown in FIG. 2A, consists of a thermoelectric module 210, a circuit load ($r_L$) 220, a high temperature heat transfer system (hot block 230) and a low temperature heat transfer system (cold block 240). The two heat transfer systems are required to maintain the temperature difference between the two plates 232, 242 and two connecting wires. Their proper design depends on the nature of the high and low temperature sources, and can be critical to the performance of the system.

An example thermal resistance network for a thermoelectric module is shown in FIG. 2B. This example thermal resistance network can be used to demonstrate and quantify the relationship between the temperature difference across the module ($T_H-T_C$) 210 to the overall available temperature difference ($T_{H\infty}-T_{C\infty}$) if the thermal resistances (the inverse of the thermal conductance) of the cold block 240, hot block 230 and module 210 can be estimated. This simplified model neglects any heat that "leaks" past the module 210 from the hot block 230 to the cold block 240, which would tend to degrade performance.

In order to maintain the plate temperature difference, the rate of heat transfer across a module must be transferred to the hot plate from the hot environment, and from the cold plate to the cold environment. These heat fluxes require a finite temperature difference, whose magnitude must increase as the thermal resistance of each block increases (or thermal conductance decreases), thereby decreasing the temperature difference that actually exists across the module.

In one embodiment of the invention, the thermoelectric power generation system may be a detachable system that may be placed on a steam pipe, and removed from the steam pipe, as required. This allows the system to be used with existing steam pipes without the need to modify the piping. This would substantially reduce the labor and materials costs associated with the installation of the system, and also prevent the interruption of a customer's service that would result from the installation of additional pipe fittings. One example embodiment includes a clamp-on system that can be readily attached directly to the surface of an existing steam pipe next to a steam meter, or other device, incorporated into the pipe system. This system will entail no violation of the existing steam system's integrity, and as such will preclude many safety and inspection considerations. In an example embodiment, the installation protocol, together with the clamping and onsite wiring, may take less than one hour to complete.

In another embodiment of the invention, the thermoelectric power generation system may be an integrated system that is fixedly coupled to, or within, a steam pipe system. This may take the form of a piping element, including an integrated thermoelectric power generation system, that is inserted into the pipe system at the time of assembly. Alternatively, the thermoelectric power generation system can be a separate element that is fixedly coupled to a pipe element during or after assembly of the pipework. In one example, the thermoelectric power generation system includes a hot block that is manufactured as an integral part of a metal casting. The metal casing may be, for example, a 316 or 346 stainless steel alloy. Alternatively, the casing may be any other appropriate material, including, but not limited to, a metal, ceramic, plastic, or composite material.

Figure 3A:
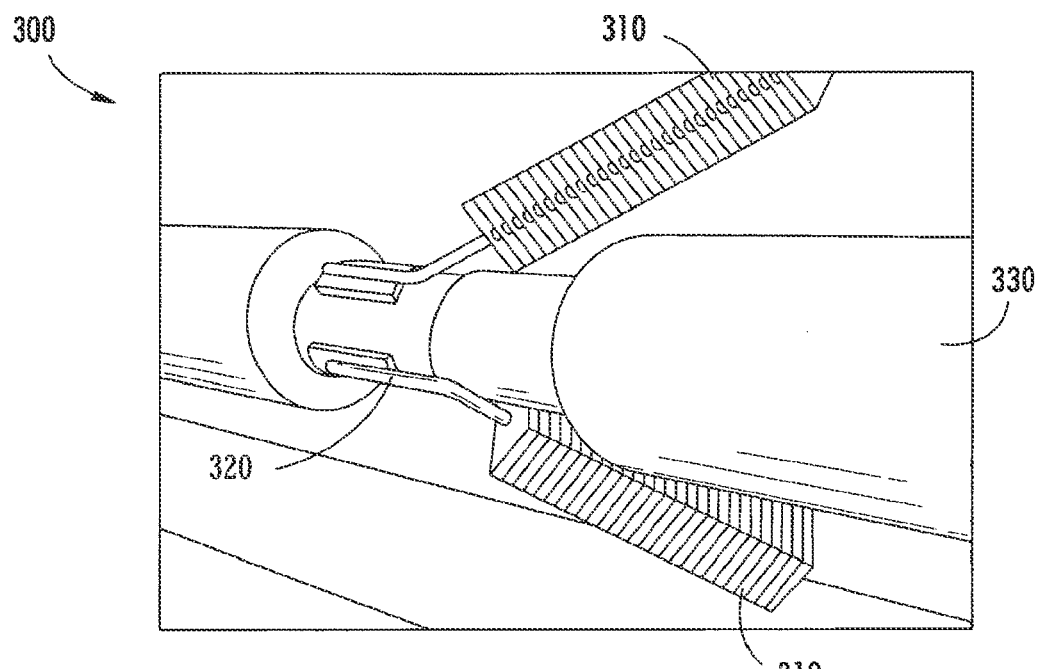
FIG. 3A is a schematic perspective view of a thermoelectric power system mounted to a steam pipe, in accordance with one embodiment of the invention.
Figure 3B:
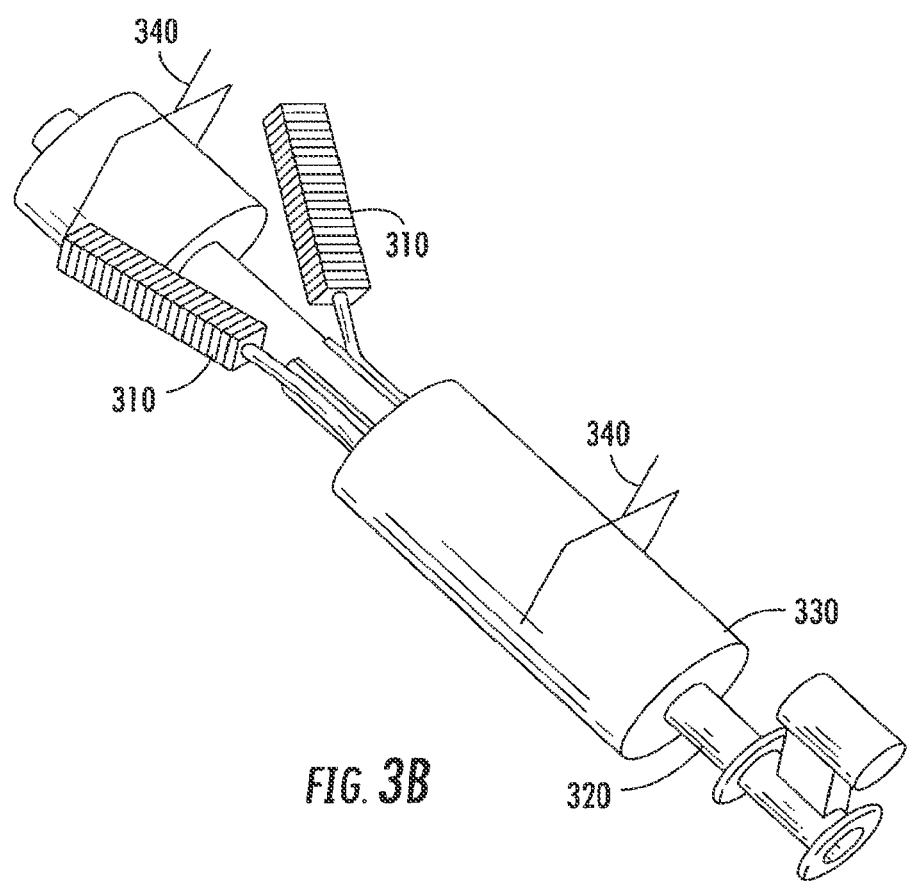
FIG. 3B is a further schematic perspective view of the thermoelectric power system of FIG. 3A.
Figure 4A:
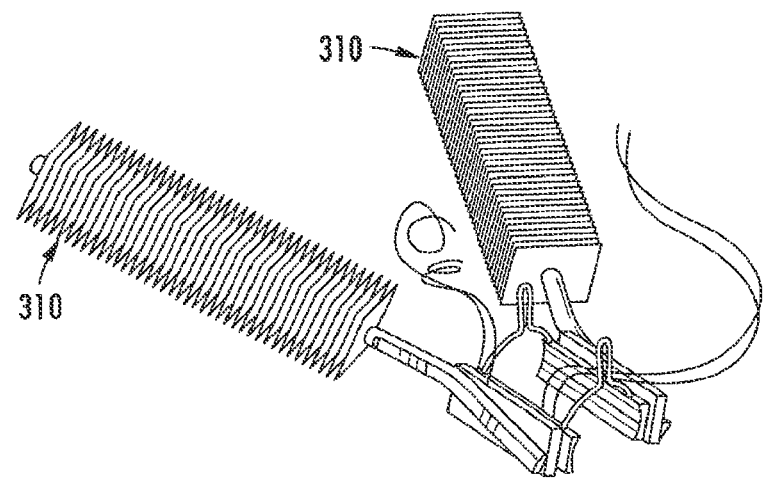
FIG. 4A is a schematic perspective view of a thermoelectric power system, in accordance with one embodiment of the invention.
Figure 4B:
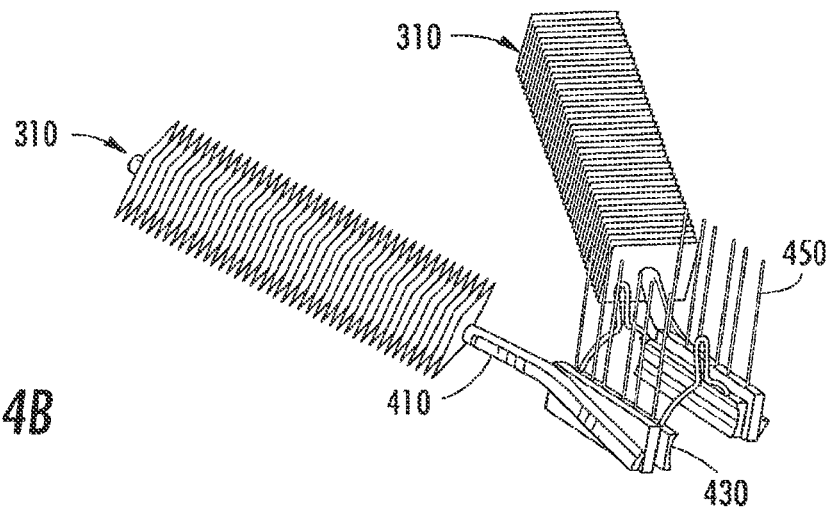
FIG. 4B is another schematic perspective view of the thermoelectric power system of FIG. 4A.
Figure 4C:
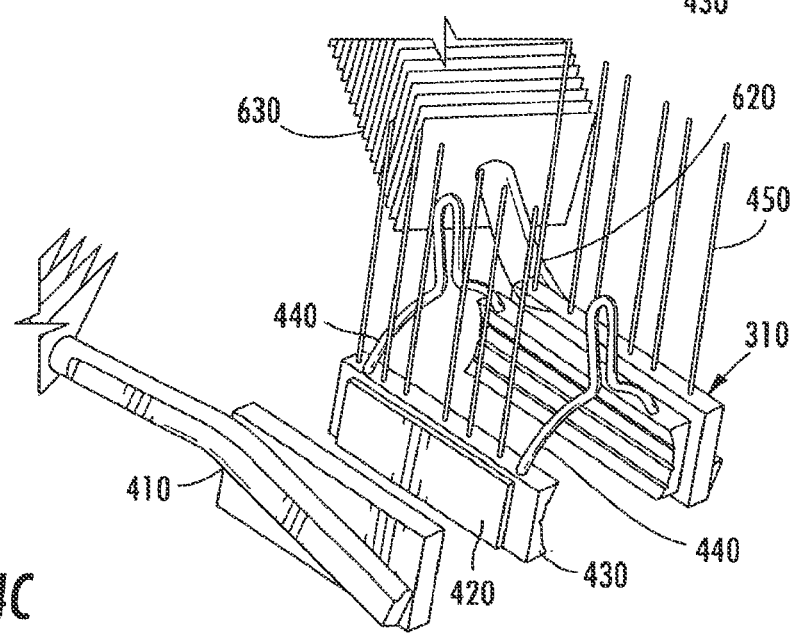
FIG. 4C is a partially exploded schematic perspective view of the thermoelectric power system of FIG. 4A.
Figure 5A:
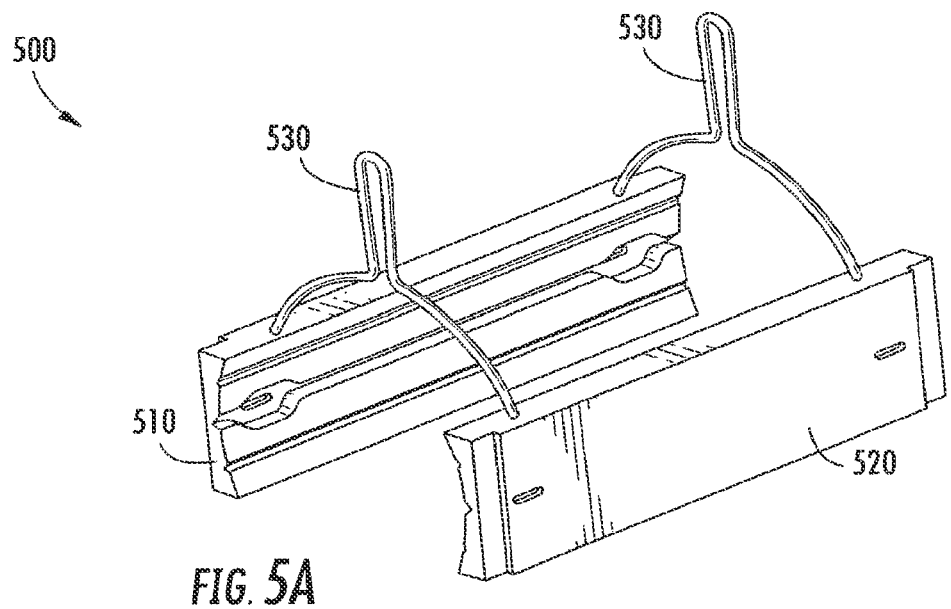
FIG. 5A is a schematic perspective view of a pair of coupled hot blocks, in accordance with one embodiment of the invention.
Figure 5B:
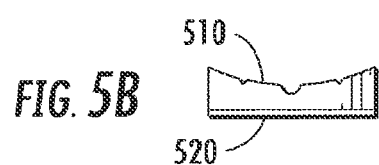
FIG. 5B is a schematic end view of a hot block, in accordance with one embodiment of the invention.
Figure 5D:
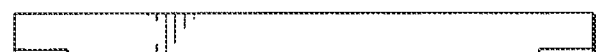
FIG. 5D is a schematic side view of the hot block of FIG. 5B.
Figure 5C:
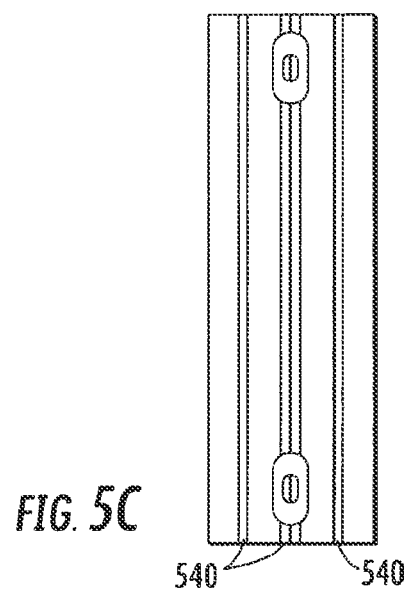
FIG. 5C is a schematic plan view of the hot block of FIG. 5B.
Figure 5E:
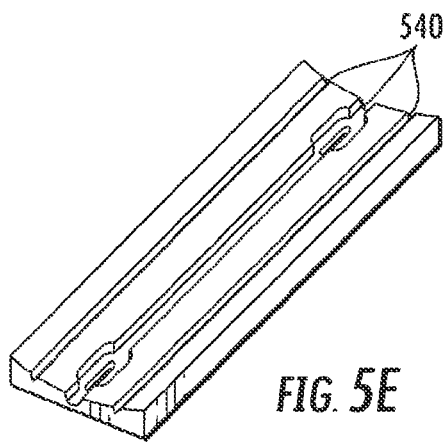
FIG. 5E is a schematic perspective view of the hot block of FIG. 5B.

An example embodiment of a thermoelectric power generation system mounted on a steam pipe can be seen in FIGS. 3A and 3B. In this embodiment, the thermoelectric power generation system 300 includes two individual assemblies 310 coupled to a steam pipe 320. Insulation 330 has been removed from the steam pipe 320 at the location of the assemblies 310. The steam pipe is mounted on brackets 340, allowing it to be mounted to the wall or roof of a steam room. Example embodiments of the thermoelectric power generation system 300 free from the steam pipe can be seen in FIGS. 4A-4C, with FIG. 4C showing a partially exploded view of one of the assemblies. The two assemblies 310 include a hot block 410, a thermoelectric module array 420, and a cold block 430. The two assemblies 310 are mounted on a pair of mounting elements, or cradles 440, which allow the system 300 to be releasably placed on an existing steam pipe, or other appropriate object, without damaging or otherwise affecting the pipe.

In operation, the mounting elements 440 allow the two individual thermoelectric power generation assemblies 310 to be placed against the outer surface of the steam pipe at circumferential positions approximately 180° apart. In alternative embodiments of the invention, the circumferential angle between the two assemblies may be greater or smaller that 180°, and can be any appropriate angle between 0° and 360°. Example ranges of angles with respect to the mounting elements may be between 30° and 330°, between 90° and 270°, or between 150° and 210°.

FIG. 4C shows a partially exploded view of one thermoelectric power generation assembly. A thermoelectric power generation system 300 can consist of a plurality of geometrically similar assemblies 310 connected together by one or more cradles 440 that facilitate placement on the steam pipe. In one embodiment, a thermoelectric power generation system can be further clamped to the steam pipe with hose clamps or other appropriate clamping mechanisms. In the embodiment of FIG. 4C, each assembly 310 consists of a module array 420 including three thermoelectric modules, with their wires 450 shown unconnected, and a heat pipe 620 and associated fins 630.

An example hot block 500 for one embodiment of the invention can be seen in FIGS. 5A-5E. The main function of the hot block 500 is to provide a curved surface 510 to mount onto the exterior of a steam pipe, and a flat surface 520 on which to mount thermoelectric modules without adding significant thermal resistance. This example hot block 500 has a length of 4.82 inches, a width of 1.59 inches, and a maximum thickness of 0.48 inches. In alternative embodiments, hot blocks of any appropriate dimension are envisioned, depending upon the requirements of the system and the specific dimensions of the object to which it is being coupled.

In certain embodiments of the invention, the mounting of the system can present special challenges. In one example embodiment, the thermoelectric power generation system can include a pair of assemblies, or more than two assemblies if required. By using more than one assembly, additional thermoelectric power can be generated. In addition, a configuration with two assemblies mounted opposite each other and coupled together by one or more cradles 530 can facilitate mounting of the system onto a steam pipe. In an example embodiment, the system can be mounted on a horizontal steam pipe suspended at a height of approximately 8 feet within a steam room, with brackets used to suspend the pipe from the ceiling. The pipe may be insulated except for where a steam meter is mounted and where the thermoelectric system is mounted.

In alternative embodiments of the invention, the system can be mounted on a steam pipe, or other appropriate piping system, suspended either vertically or at an oblique angle to the horizontal. In such embodiments, the cold blocks can be configured such that the heat pipe and associated fins extend from the mounting at an angle necessary to provide the required heat transfer characteristics. In one such embodiment the heat pipe and/or fins are permanently mounted on the cold block at an angle appropriate for the angle at which the steam pipe is set. In an alternative embodiment, the heat pipe and associated fins may be rotatably mounted on the cold block by a pivoting connection, ball and socket joint, or other rotatable mounting, allowing the system to be mounted appropriately to a steam pipe suspended at any angle.

The hot blocks can be coupled together by an inverted cradle system 530 constructed from stainless steel, welding wire, or other appropriate material, that is shaped to facilitate proper alignment on the steam pipe. This can eliminate any possibility of steam pipe warpage due to an uneven pipe surface temperature. The cradle 530 can also serve as a spring that holds the unit in place during the clamping process. The top spring section serves the additional function of providing gripping points for the installation process, thus minimizing any unnecessary contact with the hot steam pipe. In one embodiment, all wiring of the TEMs can be completed before the installation, with the cradle 530 serving as a mounting point for the wire harnesses. A spring type cradle may also compensate for thermal contraction and expansion of the steam pipe with changes in temperature, allowing the TEMs to maintain a positive connection with the steam pipe regardless of its temperature.

In one embodiment of the invention, steel can be used as the material for the hot block 500, at least because steam pipes are often also constructed from steel. In an alternative embodiment, any appropriate metal, ceramic, plastic, composite, or other material may be used to construct the hot block 500. By choosing a similar material to that of the steam pipe, any difference in the expansion and contraction rates can be eliminated, thus insuring no additional movement of the thermal interfaces between the pipe and hot block (and any thermal grease placed between the two). This solution can also eliminate any potential galvanic reactions between the steam pipe and the hot block, with the thermal grease serving as an additional galvanic barrier.

In one embodiment of the invention, parallel grooves 540 can be cut into the curved surface of the hot block. This can help to mitigate any difference in radius. It can also minimize any hot block warpage that could degrade the interface with the TEMs. These grooves 540 can serve a third function in providing a channel for the expulsion of any excess thermal grease. In different embodiments of the invention, a greater or smaller number of grooves can be incorporated into the curved face of the hot block. In further embodiments, differing shapes and/or patterns of grooves can be used. In one embodiment, one or more recessed channels or grooves may function to provide airflow through the system, if required. In one embodiment, one or more recessed channels or grooves may include one or more recessed bolt holes. These recessed bolt holes may hold bolts, or other connection elements, to releasably couple components of the device and/or stabilize the thermoelectrics and/or other components of the device.

In one embodiment of the invention, the round surface of the steam pipe may need a transition surface to the flat thermoelectric modules (TEMs), which vary no more than 0.005 inches. In one embodiment, each TEM has a hot block contact area of about 1.5 square inches, although in alternative embodiments of the invention any appropriately sized hot block and TEM can be used. Variations in the geometry of the elements of the system can allow the system to easily be adapted to steam pipes as small as 1 inch in diameter, with a hot block placed on opposite sides of the pipe at approximately 150° to 210° apart. For example, a "Schedule 160" 4 inch nominal pipe has an inside diameter of 3.49 inches. With little adaptation, it can serve as the contact surface to the 3.5 inch outer diameter steam pipe. The wall thickness is great enough to allow a flat surface to be milled that can accommodate the TEMs.

In alternative embodiments, the system can be configured to be placed on a larger diameter steam pipe. Here again, the hot block can be placed on opposite sides of the pipe at approximately 150° to 210° apart. Alternatively, the hot blocks may be placed at a smaller circumferential distance apart, with the system mounted to the pipe by means such as, but not limited to, a mechanical mounting element, a magnetic coupling, an adhesive coupling, a pressure coupling, or other appropriate mounting means.

In one embodiment, the milled outer surface of the hot block can be recessed to form one or more channels for the TEMS, which can be slid and/or oscillated into position with thermal grease between the surfaces. This can enable precise control of the TEMs position. In an alternative embodiment, the milled outer surface of the hot block can be perfectly flat, or otherwise shaped, to allow accurate abutment of the TEMs against the surface of the hot block.

In one embodiment of the invention the thermoelectric modules are assembled in units of three, although in other embodiments of the invention any appropriate number on units may be assembled together, depending upon the requirements of the system and the geometry of the pipe and/or hot blocks.

Different thermoelectric modules can be used with the thermoelectric power generation system based on the specific requirements of the system. In one example embodiment, thermoelectric modules manufactured by Melcor Incorporated, of 1040 Spruce Street, Trenton, N.J. 08648, such as a Melcor Model HT4-12-40, may be used. These modules have Teflon wires to withstand high ambient temperature conditions, thus enabling the module to meet or exceed current U.S. Military specifications. Although originally designed for thermoelectric cooling, TEMs can be used in reverse. In a cooling mode, electricity is added, and heat is transferred (or pumped) from one flat surface to the other. These can be used in reverse by creating a temperature difference between the two flat surfaces, with the temperature difference resulting in the generation of electrical energy.

Extra care must be taken in the engineering design and the assembly protocol to create a maximum temperature difference between the two flat surfaces of the TEMs. Ideally, a vacuum on the edges of the modules would be maintained. One embodiment of the invention can use special tolerance lapped modules that can be assembled in units of multiple TEMs. The end result is a generator that is so effective that changes of airflow are immediately manifest by voltage fluctuations. For each degree Fahrenheit of temperature change in a steam room's ambient temperature approximately 0.1 volt change in generated power is created.

In one embodiment, additional devices can be used to control the voltage at which the power is drawn, and/or store energy for later use. To maintain a more constant voltage and/or to create a power reservoir, a rechargeable NiCad battery, a Lithion-ion battery, a lead-acid battery, or other appropriate battery storage, can be added. In an alternative embodiment, any appropriate chemical, mechanical, or other storage devices may be used, including, but not limited to, batteries and flywheels. In one embodiment, maximum power output may be achieved for a drawn voltage of half the open-circuit voltage. In one example embodiment, a rechargeable battery can be used as a power backup device to provide power to a steam meter, one or more LED's, and/or another appropriate device upon a disruption to the driving temperature differential, such as a steam-supply shutdown during an emergency or maintenance period.

In one embodiment of the invention, thermal grease can also be used to provide a stable boundary between one of more elements of the thermoelectric power generation system, and/or between the thermoelectric power generation system and the steam pipe. An example thermal grease for use with this invention is manufactured by Arctic Silver Incorporated of 2230 W. Sunnyside Ave., Suite 6, Visalia, Calif. 93277, under the trade name Ambrosia HT. This product is unique in that it contains nano-particles that settle into any voids over a period of approximately 100 hours, thereby potentially creating an increase in system power generation after the unit is initially installed. In alternative embodiments of the invention, any appropriate thermal grease, or other interface material, may be used. In a further embodiment of the invention, no thermal grease is required.

Figure 6A:
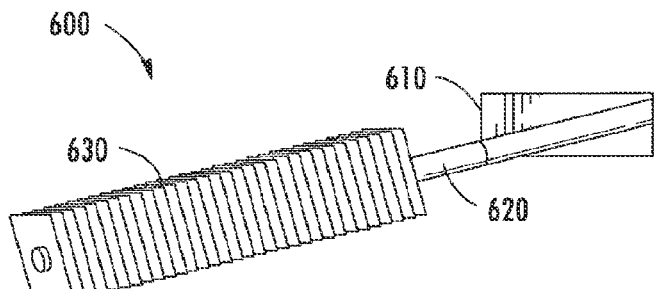
FIG. 6A is a schematic side view of a cold block system, in accordance with one embodiment of the invention.
Figure 6C:
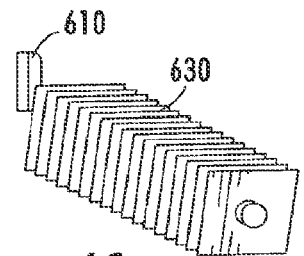
FIG. 6C is a schematic end view of the cold block system of FIG. 6A.
Figure 6B:
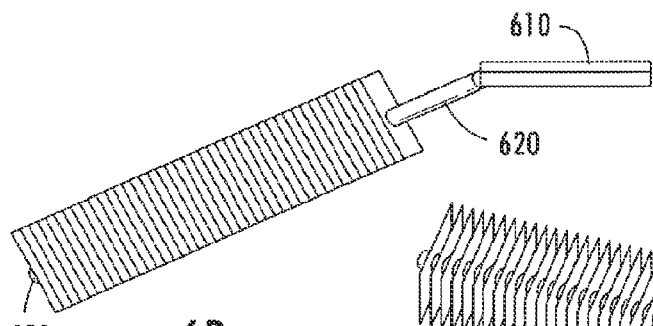
FIG. 6B is a schematic plan view of the cold block system of FIG. 6A.
Figure 6D:
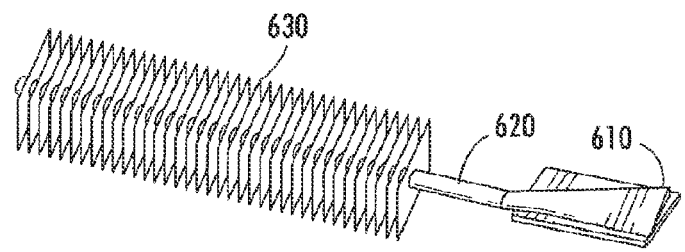
FIG. 6D is a schematic perspective view of the cold block system of FIG. 6A.
Figure 6E:
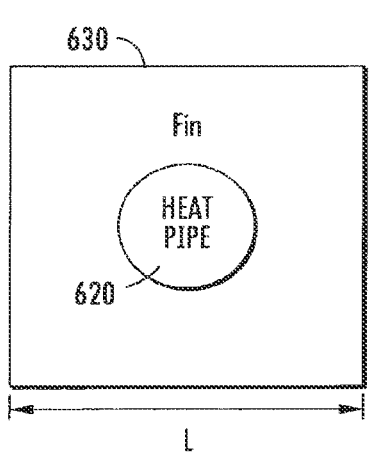
FIG. 6E is a schematic end view of a heat pipe and attached fins, in accordance with one embodiment of the invention.
Figure 6F:
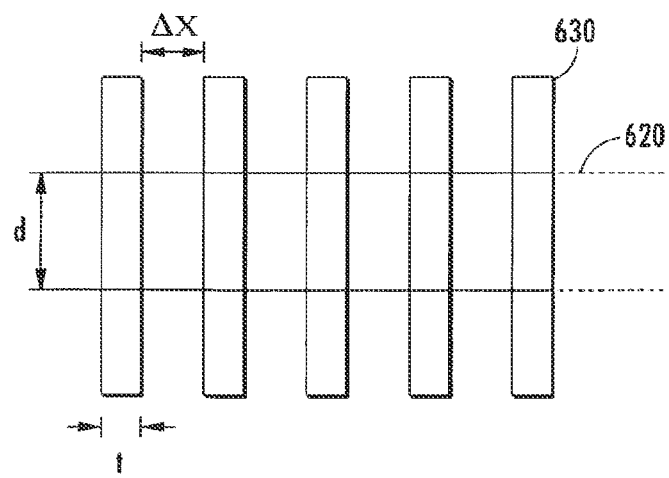
FIG. 6F is a schematic side view of the heat pipe and attached fins of FIG. 6E.

An example embodiment of a cold block system 600 for a thermoelectric power generation system is shown in FIGS. 6A though 6F. The main function of the cold block system 600 is generally to provide a thermal channel between the cold plate of the thermoelectric module array and the ambient surrounding environment. Since the mode of heat transfer ultimately involves the convective/radiative transfer of heat from a solid to ambient air (a notoriously poor heat transfer medium), the thermal goal is to provide a large exposed surface area of material as close to the cold plate temperature as possible.

An example cold block system 600 was manufactured to the inventors' specification by Noren Products Inc. of 1010 O'Brien Drive, Menlo Park, Calif. 94025. This example system's design consisted of a copper mounting block 610 (with one surface mounted on the thermoelectric module array), and a heat pipe 620 onto which evenly spaced rectangular fins 630 were mounted. The heat pipe 620 has an internal fluid transport mechanism that, when properly designed, behaves thermally as a material with a very high thermal conductivity (i.e. low thermal resistance). For heat pipes, there is a physical restriction in that the internal flow relies in part on gravity, and as a result the efficiency of the heat pipe is significantly reduced when placed horizontally. A mild angle (such as, for example, approximately 15 degrees from horizontal) may be sufficient for the heat pipe chosen, although larger or smaller angles may be used, as required by the system. The fins 630 are mounted onto the heat pipe 620. This system relies primarily on natural convection, and a restriction on the fins 630 is that in one embodiment they be nearly vertical, or at a shallow angle, to allow the flow to accelerate vertically between them. Also, the spacing must, in one embodiment, be sufficiently large that there is minimal interference between the thermal boundary layers of adjacent fins.

In one embodiment, the fins 630 may be rectangular. In alternative embodiments, square, circular, oval, or any other appropriately shaped fins may be used. In one embodiment, all the fins are of the same shape and size, but in an alternative embodiment fins of various sizes and shapes may be incorporated into a single assembly. The mounting block 610, heat pipe 620, and fins 630 may be constructed from copper, aluminum, steel, or any other appropriate metal. Alternatively, plastics, ceramics, composite materials, or any other material with appropriate structural and thermal qualities may be used.

In one embodiment, the heat pipe may be replaced by a solid rod, a hollow rod, or another appropriate elongate element with fins of appropriate size attached thereto. In an alternative embodiment, an elongate element may be used without fins. This elongate element can be constructed from a metal such as, but not limited to, copper, steel, aluminum, or another appropriate metal. In another embodiment, the elongate element can be manufactured from a material such as, but not limited to a plastic, a ceramic, and/or a composite material.

Heat pipes can be used for a variety of reasons. For example, heat pipes are known to transmit heat, and therefore have less thermal resistance, more easily than standard solid metal heat sinks. Heat pipe manufacturers claim the heat transmission in terms of watts per unit area is on a magnitude of 100 times. However, although heat pipes can be readily made, making them dependable can be problematic. Heat pipes manufactured by Noren Products Inc. have been found to be of sufficient efficiency and reliability to be used for the thermoelectric power generation system described herein. Heat pipes are also light weight, about one fifth of traditional fins for the same cooling effectiveness, and are often also somewhat flexible. A traditional heat fin may create a substantial stress on the TEMs due to the cantilevered weight. However, in alternative embodiments of the invention, other configurations of cold block, including or not including one or more heat pipe, and one or more fin, are envisioned. In one embodiment, traditional heat fins are not required in order to produce the required thermal properties within the cold block. In another embodiment, a heat pipe is not required in order to produce the required thermal properties within the cold block. In one embodiment, any configuration of cold block that can maintain a sufficiently low thermal resistance, for example with $R_c \ll R_m$, may be used.

In one embodiment, the system can consist of two mirrored heat pipes that are splayed back along the steam pipe. This configuration can decrease the amount of heat pipe that protrudes into the workspace around the steam pipe. This geometry may be important for safety concerns, where objects extending out from the pipe may be a hazard. By having the pipes splayed back along the steam pipe, it enables installation of the thermoelectric power generation system in a small volume, such as a one square foot envelope, around the steam pipe. In one embodiment, a one square foot envelope around a steam pipe is required to comply with safety regulations. An added advantage is that a natural convection current around the steam pipe accelerates the cooling.

One embodiment of the invention includes a theoretical model of the thermoelectric power generation system. The theoretical model analysis may require estimations of the thermal resistance of both the hot and cold blocks of a thermoelectric power generation system.

An example thermal analysis of a hot block is described below, in accordance with one embodiment of the invention. The thermal analysis may be carried out for any configurations of hot block described herein.

Figure 7:
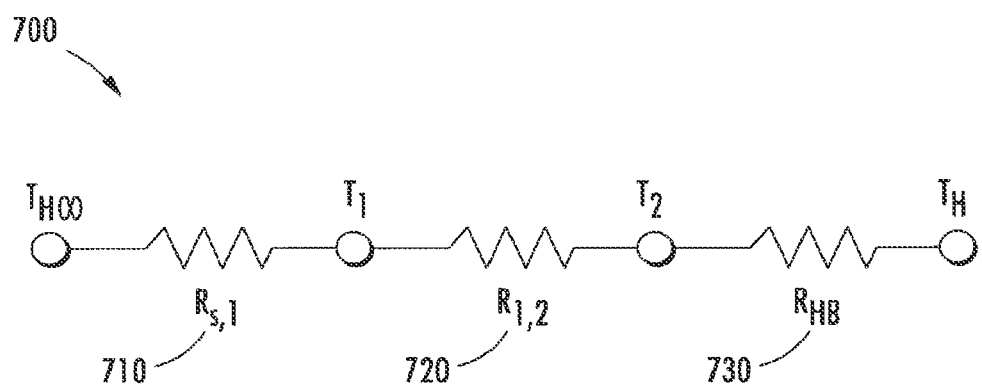
FIG. 7 is a thermal resistance network for a hot block, in accordance with one embodiment of the invention.

An example thermal resistance network 700 for a hot block is shown in FIG. 7. In order for heat to flow from the fluid within the pipe (i.e. a high temperature medium such as, but not limited to, steam) to the hot plate of the module, it must first be transferred to the inner surface of the steam pipe, then through the pipe wall, then across the hot block in contact with the hot plate. Therefore, the thermal network consists of 3 resistances in series:

$$R_H = R_{s,1} + R_{1,2} + R_{HB} (+ R_{contact1} + R_{contact2})$$

Two contact resistances are shown in parentheses (between the hot block and the steam pipe, and between the hot block and TEM). These resistances may be difficult to quantify, and may be negligible if good thermal contact is maintained (e.g. by the use of a thermal grease, or other appropriate interface medium). The thermal resistance between the steam and the pipe inner wall ($R_{s,1}$) 710 is a convective resistance and is approximated by $R_{s,1} = 1/(h_s A_s)$ where $A_s$ is the effective surface area which will be somewhat larger than the contact area of the module array due to 3-dimensional effects, and $h_s$ is the convective coefficient of the condensing steam on the inside wall of the pipe.

The thermal resistance across the pipe wall 720 is a conductive resistance and is approximated by $R_{1,2} \approx t_{pipe}/(k_{pipe} A_p)$ where $A_p$ is the effective conductive area which again will be somewhat larger than the surface area of the hot block due to 3-dimensional effects, $t_{pipe}$ is the pipe wall thickness and $k_{pipe}$ is the thermal conductivity of the pipe wall.

The thermal resistance across the hot block 730 is also conductive, and is approximated by $R_{HB} \approx t_{block}/(k_{block} A_b)$ where $A_b$ is taken to be the average area of the two contact surfaces of the block, $t_{block}$ is the average thickness of the block and $k_{block}$ is the thermal conductivity of the hot block. In one embodiment of the invention, ridges or grooves can be built into the hot block for purposes such as, but not limited to, receiving excess thermal grease and reducing warpage.

Combining terms, with their approximations:

$$R_H = \left( \frac{1}{h_s A_s} + \frac{t_{pipe}}{k_{pipe} A_p} + \frac{t_{block}}{k_{block} A_b} \right)$$

Here, the areas are all nearly equal to the contact area of the three modules. Assuming properties of typical steel for the pipe and hot block, and a convection coefficient typical of condensing steam, and inserting numerical values for the three module array used:

$$R_H = \frac{1}{(0.04 \text{ m})(0.12 \text{ m})} \left( \frac{1}{6000 \text{ W/m}^2 {}^\circ \text{C.}} + \frac{0.0095 \text{ m}}{40 \text{ W/m} {}^\circ \text{C.}} + \frac{0.016 \text{ m}}{40 \text{ W/m} {}^\circ \text{C.}} \right)$$

$$R_H = (0.035 + 0.050 + .0833) = 0.17 \frac{{}^\circ \text{C.}}{\text{W}}$$

In alternative embodiments of the invention, other materials, such as any appropriate metal, ceramic, plastic, or composite material, may be used for the pipe and/or hot block.

In one embodiment, the various values can be isolated to demonstrate that approximately half of the resistance is due to the hot block, and half due to the combination of condensation and conduction through the pipe wall. That is, the thermal resistance added with the hot block is comparable to the inherent thermal resistance of the existing pipe. Comparing the thermal resistance of the hot block to the module array (the thermal conductance of the module taken to be 0.5 W/° C. at 100° C.):

$$\frac{R_H}{R_M} = \frac{n_M R_H}{R_{M,single}} = \frac{3*(0.17)}{\left(\frac{1}{0.5}\right)} = 0.255$$

The thermal resistance of the hot block can therefore be about 4 times lower than that of the module array, although it cannot generally be neglected.

Figure 8A:
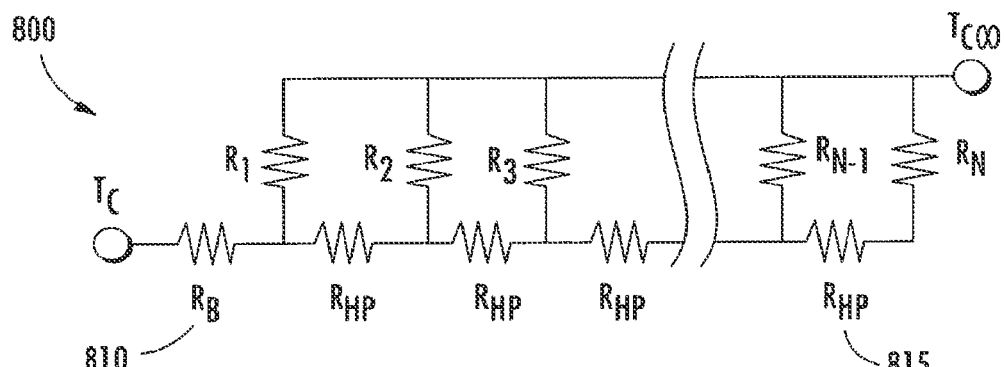
FIG. 8A is a thermal resistance network for a cold block, in accordance with one embodiment of the invention.
Figure 8B:
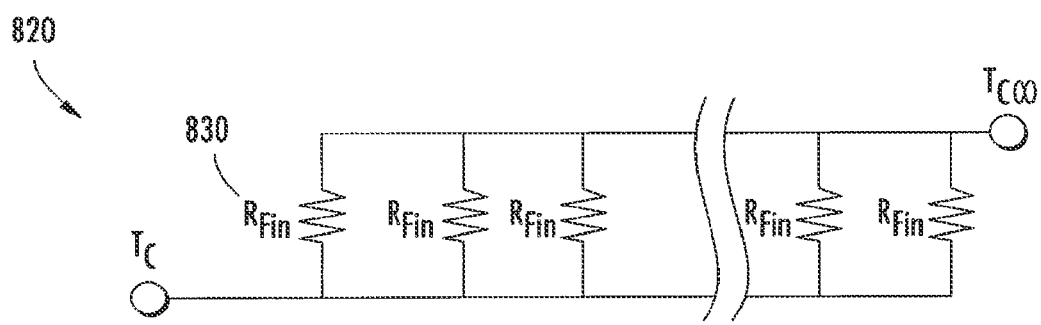
FIG. 8B is a simplified thermal resistance network for the cold block of FIG. 8A.

An example thermal analysis of a cold block is described below, in accordance with one embodiment of the invention. The thermal analysis may be carried out for any configurations of cold block described herein. Complete and simplified thermal resistance networks for the cold block can be seen in FIGS. 8A and 8B.

In one embodiment of the invention, the system can consist of a copper block (in direct contact with the TEM array) which is soldered to a heat pipe onto which are attached evenly spaced square fins. In an example embodiment, in the complete resistance network 800, it is recognized that there is, in principle, a thermal resistance between the TEM and the point of attachment of the heat pipe, represented by $R_B$ 810 in FIG. 8A. This resistance can be shown to be small compared to the module resistance (provided good thermal contact between the module and block is maintained) and is neglected in the simplified model, shown in FIG. 8B. Similarly, the resistance associated with the heat pipe between the bases of adjacent fins ($R_{HP}$) 815 is neglected in comparison with the resistance of individual fins. A consequence of these assumptions is that the base of each fin (the point of attachment to the heat pipe) is maintained at the temperature of the cold plate of the TEM ($T_C$). In practice, this relationship will generally hold provided the heat pipe is capable of acting effectively over the required length. A simplified model of the cold block 820 can therefore be represented by a system of parallel resistances, and the cold block resistance ($R_C$) then becomes:

$$\frac{1}{R_C} = \frac{1}{R_1} + \frac{1}{R_2} + \frac{1}{R_3} + \ldots + \frac{1}{R_{N-1}} + \frac{1}{R_N}$$

Assuming all the fin resistances are equal ($R_1 = R_2 = R_3 = \ldots = R_{N-1} = R_N = R_{Fin}$) 830, the system reduces to:

$$\frac{1}{R_C} = \sum_1^N \frac{1}{R_{Fin}} = \frac{N}{R_{Fin}}, \text{ or } R_C = \frac{R_{Fin}}{N}$$

Figure 8C:
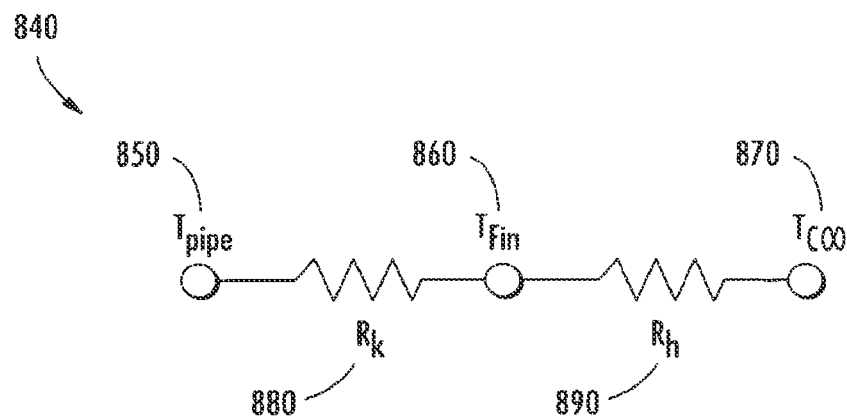
FIG. 8C is a simplified thermal resistance network for an individual fin, in accordance with one embodiment of the invention.

The final step is to estimate the thermal resistance of individual fins. The fin resistance is approximated using the simplified thermal resistance network 840 shown in FIG. 8C, in which $T_{pipe}$ 850 is the temperature of the base of the fin (the attachment point on the heat pipe), $T_{fin}$ 860 represents the average temperature of the fin and $T_{C\infty}$ 870 is the ambient air temperature. The resistance $R_k$ 880 is a conductive resistance associated with heat being conducted within the fin material from the base toward the outer perimeter and is approximated by:

$$R_k = \frac{(\text{Conduction Distance})}{k * \overline{A}_{fin}} = \frac{(L/2)}{k * \frac{1}{2}[4tL + \pi d]} = \frac{1}{4kt\left[1 + \frac{\pi d}{4L}\right]}$$

$$R_k \approx \frac{1}{4kt} \text{ for } d \ll L$$

The convective resistance $R_h$ 890 is the resistance associated with heat being transferred from the fin to the ambient air and is approximated by:

$$R_h = \frac{1}{h*(\text{Surface Area})} = \frac{1}{h*2\left[L^2 - \frac{\pi d^2}{4}\right]} = \frac{1}{2hL^2\left[1 - \frac{\pi}{4}\left(\frac{d}{L}\right)^2\right]}$$

$$R_h \approx \frac{1}{2hL^2} \text{ for } d \ll L$$

where h is the convection coefficient, which can be estimated using natural convection correlations.

The heat transfer rate is given by:

$$q_{fin} = \frac{T_{pipe} - T_\infty}{R_k + R_h} = \left(\frac{T_{pipe} - T_\infty}{R_k}\right)\left[\frac{1}{R_k/R_h + 1}\right]$$

In the limit of d much less than L, and after minor rearrangement, the heat transfer rate becomes:

$$q_{fin} = \frac{2\pi hL^2(T_{pipe} - T_\infty)}{\left(\frac{hL^2}{2kt}\right) + 1} = \frac{2\pi hL^2(T_{pipe} - T_\infty)}{\left(\frac{L}{L^*}\right)^2 + 1}$$

where $$L^* = \sqrt{\frac{2kt}{h}}$$

is the characteristic distance from the fin base over which temperature changes occur. The thermal resistance of the fin is:

$$R_{fin} = \frac{(L/L^*)^2 + 1}{2hL^2}$$

The performance of the thermoelectric system can be determined by the ratio of the resistance of the cold block to the module array, which can be expressed in terms of system parameters as:

$$\frac{R_C}{R_M} = \frac{R_{fin}/N}{R_{M\,single}/n_M} = \left(\frac{n_m}{N}\right)\frac{(L/L^*)^2 + 1}{2hL^2 R_{M,single}}$$

The convection coefficient, h, is estimated from standard correlations natural convection on a vertical surface). The Churchill-Chu equation is given by:

$$Nu_L = \frac{hL}{k_{air}} = 0.68 + \frac{0.67 Ra_L^{0.25}}{\left[1 + \left(\frac{0.492}{Pr}\right)^{9/16}\right]^{4/9}}$$

Where:

$$Ra_L = Gr_L * Pr = \frac{g\beta(T_{fin} - T_{Ox})L^3}{v\alpha} \leq 10^9$$

$$Pr = \frac{v}{\alpha}$$

This equation can be found at p. 529 of "Engineering Heat Transfer" by William S. Janna, PWS Publishers (hereinafter "Janna") the disclosure of which is incorporated herein by reference in its entirety. The Bar-Cohen equations, as disclosed at p. 549 of Janna, can be used to estimate the minimum spacing needed:

$$\Delta x \geq 2.89 \left[\frac{Lx^2}{g\beta(T_{fin} - T_\infty)Pr}\right]^{0.25}$$

Since the convection coefficient is a function of the fin temperature, and is not known beforehand, an iterative procedure may be needed.

Example 1

An example embodiment of the invention is described below. The example embodiment consists of a thermoelectric power generation system including a pair of assemblies. The two assemblies were identical except for the material and thickness used for the fins (specifically, 0.02 inch thick aluminum and 0.03 inch thick copper). Example parameter values assumed in the theoretical analysis are listed in the table in FIG. 9A. The table in FIG. 9B shows important derived quantities used in the thermal analysis. In this specific example, the thermoelectric module used was a Melcor Model HT4-12-40, constructed by Melcor Incorporated, of 1040 Spruce Street, Trenton, N.J. 08648.

The test bed used for testing the example thermoelectric power generation systems had a temperature of approximately 125° F. at an elevation of 6 feet above the floor in the summer and 115° F. in the winter. Preliminary data suggested that the test bed has a higher than average room temperature. The vortex steam meter used for the tests was connected to a 3.5 inch outside diameter steam pipe.

The system (based on 6 thermoelectric modules) produces a steady open circuit voltage of approximately 17 Volts and short circuit current of 0.65 Amps. These values fluctuate with the ambient room temperature and air currents. A dedicated steam line for the generator was not necessary. The cost of all system components was less than $1500.

Figure 10A:
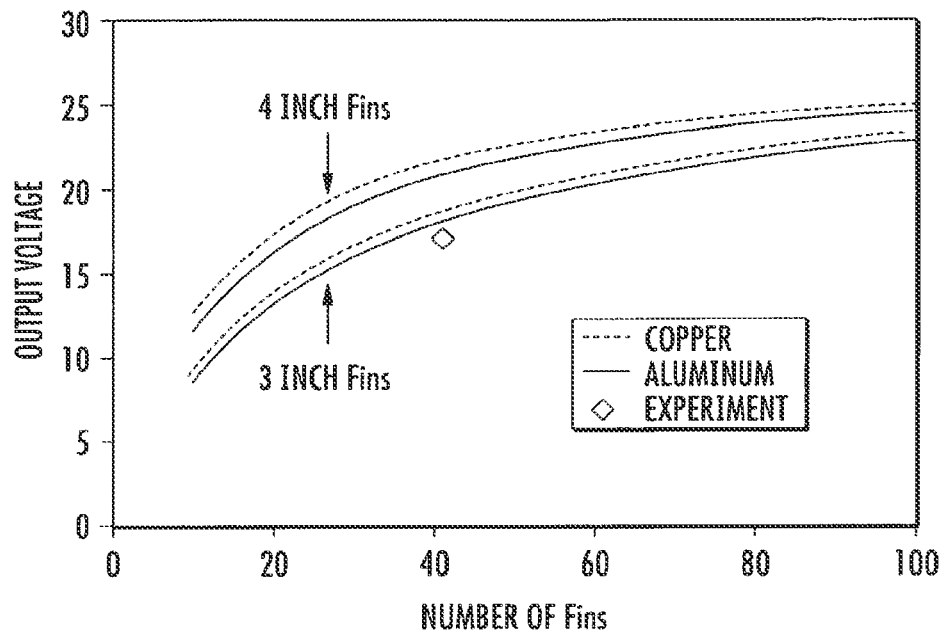
FIG. 10A is a plot of system open-circuit voltage as a function of the number of fins for the thermoelectric power system of FIG. 9A.

Example theoretical and experimental results are shown in FIG. 10A, with the open circuit voltage plotted as a function of the number of fins placed on the heat pipes. Experimental point and theoretical predictions are obtained from a pair of thermoelectric banks. These results are for a pair of thermoelectric banks wired in series. Results are shown for both 3 inch and 4 inch copper and aluminum fins. The experimental output from the tested thermoelectric power generation system, which included 41 fins of 3 inch length, was 17.2 Volts. This compared favorably with the theoretical prediction of 18.4 Volts, where this prediction was taken from the average of 18.1 Volts for Aluminum and 18.8 Volts for Copper, since one of each was used experimentally.

The output voltage increases as fins are added to the heat pipe due to the increase surface area exposed to the ambient, reducing the thermal resistance of the cold block. There are diminishing returns, however, and an ultimate limit is reached as the thermal resistance of the cold block becomes much less than that of the module array. For example, doubling the number of fins (and heat pipe length) from 41 to 82 fins results in modest 22% increase in output voltage (18.1 to 22.1 Volts). This longer heat pipe would be double the weight and be more unwieldy than the design chosen.

There is a slightly higher voltage for copper fins for at least two reasons. Copper has nearly double the thermal conductivity of aluminum, and the copper fins have a larger thickness in the example embodiment described herein. However, the difference is small because the fins are effectively "thermally short"; the characteristic fin lengths (L*) are 13.0 inches for copper and 7.5 inches for aluminum, resulting in fin resistances of 16.2 and 17.8° C./W for copper and aluminum, respectively. Since the fin dimension used (3 inches) is less than half the characteristic length for aluminum, the temperature drop along the fins (between the base at the heat pipe and the outer perimeter) is small.

Since the fins are thermally short, improvements in performance can be made by increasing the fin dimension (L). For example, the 4 inch fins exhibit a 16% increase is output voltage over the 3 inch fins. This modification represents an 87% increase in surface area. Essentially the same output improvement can be obtained by adding 78% more fins (to 72 total fins) of the same 3 inch dimension. Therefore, the relative cost of adding more fins against adding larger fins would be the main factor in improving the performance, with the heat pipe length being an additional consideration.

Figure 10B:
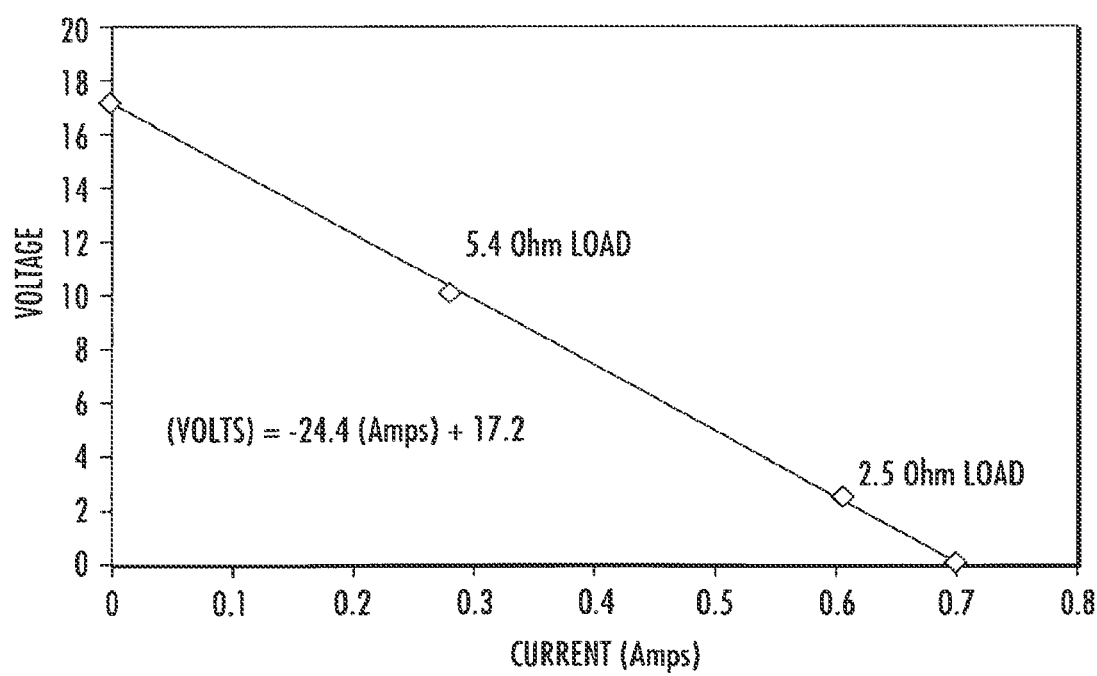
FIG. 10B is a plot of a system voltage as a function of current for the thermoelectric power system of FIG. 9A.

The natural convection coefficient increases with decreasing vertical dimension of the fins. Therefore, another means of improving performance (for thermally short fins) would be to use rectangular, rather than square, fins. For example, under these conditions, the convection coefficient is 5.9 W/m$^{2}$° C. for 3 inch fins, and 7.2 W/m$^{2}$° C. for 2 inch fins. The predicted output voltage increases from 18.4 to 19.5 Volts if fins of 2 inches (vertical) by 4.5 inches are used, a 6.0% increase without increasing the fin area. These results demonstrate the output open circuit voltage, not how the system responds to an electrical load (with current being drawn). Therefore, the system output voltage and current were measured when the system was used to drive two different light bulbs. FIG. 10B shows an example experimental operating line of the system as a Voltage vs. Current plot. The point on the voltage axis (zero current) is the open circuit voltage of 17.2 V), and the point on the current axis (zero voltage) is the short circuit current (0.70 Amps). The plot is linear between these two points, with a slope equal to 24.4 Ohms. Experimental results obtained over a two hour period (for an open circuit) and a ten minute period (for a short circuit) showed the output to be extremely stable.

In an alternative embodiment, a system including a plurality of modules may be configured to generate any appropriate electrical power output through careful selection of factors including, but not limited to, the number of modules, the materials used, the steam pipe used, and the geometries of each module. For example, in one embodiment including six assemblies placed on a 3-inch steam pipe, a generation system can produce a steady open circuit voltage of approximately 32 Volts and short circuit current of approximately 0.89 Amps. These values may be increased further, for example, by increasing the number and size of the fins.

Alternative embodiments of the invention may include any of the features described herein. For example, elements of the thermoelectric power generation assemblies may be constructed from any appropriate material, such as, but not limited to, metals, ceramics, plastics, composite materials, or any other appropriate material or combination thereof. The thermoelectric power generation system, as envisioned, may also be releasably coupled to other objects than steam pipes, such as, but not limited to, any heating or plumbing pipes, other fluid transport pipes, such as oil or gas pipelines, or exhaust pipes or other pipes associated with automobiles and other forms of transport. Additionally, the thermoelectric power generation system may be releasably coupled to any appropriately shaped object, including, but not limited to, cylindrical, rectangular, square, oval, or other shaped pipes or objects. The thermoelectric power generation systems described herein may also include various numbers of assemblies, with each assembly including any appropriate number of fins, heat pipes, thermoelectric modules, grooves, and cradles.

In one example embodiment, one or more thermoelectric power generation assemblies can be used to generate enough electrical energy to power a low voltage telemetry and wireless communication system for placement within a steam manhole or other remote location. These systems can be used to provide continuous monitoring and/or control of the conditions within the remote location, and automatically provide safety and/or maintenance information to a remotely situated monitoring station. Such a system can reduce the need for regular visual inspections of a steam pipe system and provide alerts and/or remotely operated safety measures should any problems occur within the steam system.

In one example embodiment, the system can include devices including, but not limited to, a steam flow meter, a temperature meter, a humidity meter, a gas meter, a lighting system, an alarm, a wireless communication system (such as, but not limited to, a Bluetooth™ wireless system), a safety control system, a cut-off valve controller, and/or any other appropriate device for monitoring, controlling, and/or providing information about the conditions within the manhole or other remote location.

Example embodiments of thermoelectric power generation assemblies for powering one or more telemetry and/or monitoring systems may include mounting one or more generation assemblies on a steam pipe inside a manhole (such as, for example, a 1-inch, 2-inch, 3-inch, or larger steam pipe) and connecting the measurement/control/communication devices directly to this generation assembly. Alternatively, one or more generation assemblies may be mounted on larger steam mains within the steam system, where larger temperature gradients may be available if greater power is required. Mounting to such large steam mains may require the utilization of additional insulation of the steam main to compensate for the increased temperature caused by the generator. These generation assemblies may then be used to power multiple devices within a larger monitoring and control system. For example, in one embodiment, low voltage power and telemetry lines may be installed between a plurality of manholes to provide a network of monitoring stations, each one either powered by separate thermoelectric power generation assemblies or powered from one or more central thermoelectric power generation assembly coupled to a larger steam main.

In an alternative embodiment, one or more thermoelectric power generation assemblies may be adapted to utilize water collected within a manhole or other remote location to increase the thermal gradient between the steam pipe and the surrounding atmosphere, and thus increase the power generated. This may be achieved, for example, by collecting water entering the manhole and passing this water over an elongate element (such as, but not limited to, a heat pipe or a solid or hollow rod) and/or fins to increase the heat transfer between the fins and the surrounding atmosphere. This may, for example, be advantageous in an emergency situation where additional power is required by the system.

It should be understood that alternative embodiments, and/or materials used in the construction of embodiments, or alternative embodiments, are applicable to all other embodiments described herein.

Another example embodiment of a thermoelectric power generation assembly for powering one or more electrical devices can include mounting one or more generation assemblies on a fluid transportation system adapted to transport a fluid at a temperature below that of the surrounding ambient atmosphere. Example fluid transportation systems can include, but are not limited to, pipes for transporting cold water, refrigerant, cold air or other gas(es), or any other appropriate fluid. In such an embodiment, the temperature at a surface of the pipe, or other component of the fluid transportation system, is maintained at a temperature below that of the atmosphere directly surrounding the pipe. As a result, by placing one or more thermoelectric power generation assemblies on the pipe in the same manner as described above, but with the polarity of the system reversed to account for the opposite direction of the heat transfer (i.e. from surrounding atmosphere to pipe), a DC power source for powering one or more electrical devices can be produced. This assembly can include any combination of the elements described hereinabove.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. An apparatus for thermoelectrically generating power from a heat source, the apparatus comprising:
    a thermoelectric device comprising:
    a first heat transfer element, wherein a first surface of the first heat transfer element is configured to conform to at least a portion of the outer surface of the heat source and a second surface of the first heat transfer element comprises a recess;
    a thermoelectric module coupled to the first heat transfer element, wherein (i) the thermoelectric module generates an electrical signal in response to a temperature difference over a thickness of the thermoelectric module, and (ii) the thermoelectric module comprises a third surface configured to be slidingly coupled, within the recess, to the first heat transfer element; and
    a second heat transfer element comprising a mounting block and a heat exchanging element, the heat exchanging element comprising at least one heat pipe and a plurality of fins distributed on the heat pipe, wherein (i) the heat exchanging element is configured to exchange heat between the thermoelectric device and the surrounding atmosphere, (ii) a portion of the heat pipe with the plurality of fins distributed thereon extends from the mounting block at a shallow angle from horizontal such that the portion of the heat pipe is splayed back along an axial direction of the heat source, and (iii) the fins are aligned at no greater than a shallow angle from vertical to take advantage of natural convection.

2. The apparatus of claim 1, wherein the heat source comprises a fluid transportation pipe.

3. The apparatus of claim 1, wherein the plurality of fins are rectangular.

4. The apparatus of claim 1, wherein the first surface of the first heat transfer element comprises at least one groove.

5. The apparatus of claim 1, wherein the first heat transfer element and the outer surface of the heat source comprise a similar material.

6. The apparatus of claim 1, wherein the at least one thermoelectric module is configured to power at least one electrical device.

7. The apparatus of claim 6, wherein the at least one electrical device is selected from the group consisting of a control device, a measurement device, a safety device, a security device, a light, a lighting system, a light-emitting diode, a communication device, a steam flow meter, a temperature meter, a humidity meter, a gas meter, a cut-off valve controller, an alarm, and a battery.

8. The apparatus of claim 1, wherein the apparatus comprises a detachable device.

9. The apparatus of claim 1, further comprising at least one regulating battery coupled to the at least one thermoelectric module.

10. A method of thermoelectrically powering an electrical device, the method comprising the steps of:
   providing at least one thermoelectric power generation apparatus comprising:
   a thermoelectric device comprising:
   a first heat transfer element, wherein a first surface of the first heat transfer element is configured to conform to at least a portion of the outer surface of a heat source and a second surface of the first heat transfer element comprises a recess;
   a thermoelectric module coupled to the first heat transfer element, wherein (i) the thermoelectric module generates an electrical signal in response to a temperature difference over a thickness of the thermoelectric module, and (ii) the thermoelectric module comprises a third surface configured to be slidingly coupled, within the recess, to the first heat transfer element; and
   a second heat transfer element comprising a mounting block and a heat exchanging element, the heat exchanging element comprising at least one heat pipe and a plurality of fins distributed on the heat pipe,
   wherein (i) the heat exchanging element is configured to exchange heat between the thermoelectric device and the surrounding atmosphere, (ii) a portion of the heat pipe with the plurality of fins distributed thereon extends from the mounting block at a shallow angle from horizontal such that the portion of the heat pipe is splayed back along an axial direction of the heat source, and (iii) the fins are aligned at no greater than a shallow angle from vertical to take advantage of natural convection,
   releasably mounting the thermoelectric power generation apparatus to the outer surface of the heat source;
   coupling the thermoelectric power generation apparatus to an electrical device; and
   providing power to the electrical device, wherein the electrical power is generated in response to a temperature difference over the thermoelectric power generation apparatus.

11. The method of claim 10, further providing at least two thermoelectric power generation apparatus.

12. The method of claim 11, wherein the at least two thermoelectric power generation apparatus are coupled together by a mounting element.

13. The method of claim 12, wherein the mounting element is configured to releasably couple the at least two thermoelectric power generation assemblies to the heat source.

* * * * *